US008635311B2

(12) United States Patent
Engstrom et al.

(10) Patent No.: US 8,635,311 B2
(45) Date of Patent: *Jan. 21, 2014

(54) METHOD AND SYSTEMS FOR GENERATING AND SENDING A HOT LINK ASSOCIATED WITH A USER INTERFACE TO A DEVICE

(75) Inventors: G. Eric Engstrom, Kirkland, WA (US); Peter Zatloukal, Duvall, WA (US); Tyrol R. Graham, Seattle, WA (US)

(73) Assignee: Varia Holdings LLC, Brooklyn, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/427,794

(22) Filed: Mar. 22, 2012

(65) Prior Publication Data

US 2012/0208510 A1 Aug. 16, 2012

Related U.S. Application Data

(63) Continuation of application No. 10/477,046, filed as application No. PCT/US02/14909 on May 10, 2002, now Pat. No. 8,166,139.

(60) Provisional application No. 60/290,592, filed on May 11, 2001.

(51) Int. Cl.
*G06F 15/177* (2006.01)

(52) U.S. Cl.
USPC .............................. 709/221; 709/220; 709/248

(58) Field of Classification Search
None
See application file for complete search history.

(56) References Cited

U.S. PATENT DOCUMENTS

| 5,153,902 | A | 10/1992 | Buhl et al. |
| 5,493,692 | A | 2/1996 | Theimer et al. |
| 5,572,442 | A | 11/1996 | Schulhof et al. |
| 5,689,799 | A | 11/1997 | Dougherty et al. |

(Continued)

FOREIGN PATENT DOCUMENTS

| WO | 02093400 | 11/2002 |
| WO | 02093408 | 11/2002 |

(Continued)

OTHER PUBLICATIONS

International Search Report for Application No. PCT/US02/14594, mailed Jul. 15, 2002.

(Continued)

*Primary Examiner* — Mohamed Ibrahim
(74) *Attorney, Agent, or Firm* — Schwabe, Williamson & Wyatt, P.C.

(57) ABSTRACT

The invention sends a hot link to a device. The device may be on a wireless network, a wired network, or directly coupled to the device sending the hot link. The hot link contains an associated action that is performed by the device receiving the hot link. The associated action may be performed when a user interface is activated or automatically when the hot link is received by the device. The action can be a broadcast action, Internet action, call action, download action, or upload action. The broadcast action instructs the device to tune to a particular broadcast in response to the selection of the user interface. The internet action instructs the device to access an Internet site in response to the selection of the user interface. The call action instructs the device to call a telephone number in response to the selection of use interface.

20 Claims, 13 Drawing Sheets

(56) References Cited

U.S. PATENT DOCUMENTS

| | | | |
|---|---|---|---|
| 5,694,455 A | 12/1997 | Goodman | |
| 5,734,487 A | 3/1998 | Rossi | |
| 5,742,668 A | 4/1998 | Pepe et al. | |
| 5,749,043 A | 5/1998 | Worthy | |
| 5,793,365 A | 8/1998 | Tang et al. | |
| 5,797,087 A | 8/1998 | Lee | |
| 5,913,153 A | 6/1999 | Nakamoto et al. | |
| 5,963,861 A | 10/1999 | Hanson | |
| 6,014,090 A | 1/2000 | Rosen et al. | |
| 6,047,327 A | 4/2000 | Tso et al. | |
| 6,097,441 A | 8/2000 | Allport | |
| 6,108,534 A | 8/2000 | Bourgeois et al. | |
| 6,151,485 A | 11/2000 | Crisp | |
| 6,161,002 A | 12/2000 | Migliaccio et al. | |
| 6,163,683 A | 12/2000 | Dunn et al. | |
| 6,212,548 B1 | 4/2001 | DeSimone et al. | |
| 6,223,029 B1 | 4/2001 | Stenman et al. | |
| 6,226,444 B1 | 5/2001 | Goldschmidt Iki et al. | |
| 6,236,844 B1 | 5/2001 | Cvetkovic et al. | |
| 6,253,069 B1 | 6/2001 | Mankovitz | |
| 6,324,266 B1 | 11/2001 | Mannings | |
| 6,331,825 B1 | 12/2001 | Ladner et al. | |
| 6,333,973 B1 | 12/2001 | Smith et al. | |
| 6,349,220 B1 | 2/2002 | Prior et al. | |
| 6,405,203 B1 | 6/2002 | Collart | |
| 6,411,685 B1 | 6/2002 | O'Neal | |
| 6,418,308 B1 | 7/2002 | Heinonen et al. | |
| 6,448,978 B1 | 9/2002 | Salvador et al. | |
| 6,453,300 B2 | 9/2002 | Simpson | |
| 6,473,609 B1* | 10/2002 | Schwartz et al. | 455/406 |
| 6,507,764 B1 | 1/2003 | Parrella et al. | |
| 6,522,875 B1 | 2/2003 | Dowling et al. | |
| 6,526,335 B1 | 2/2003 | Treyz et al. | |
| 6,563,805 B1 | 5/2003 | Ma et al. | |
| 6,571,279 B1 | 5/2003 | Herz et al. | |
| 6,587,127 B1 | 7/2003 | Leeke et al. | |
| 6,587,835 B1 | 7/2003 | Treyz et al. | |
| 6,590,588 B2 | 7/2003 | Lincke et al. | |
| 6,591,116 B1 | 7/2003 | Laurila et al. | |
| 6,600,908 B1 | 7/2003 | Chan | |
| 6,628,928 B1 | 9/2003 | Crosby et al. | |
| 6,647,257 B2 | 11/2003 | Owensby | |
| 6,650,891 B1 | 11/2003 | Wierzbitzki et al. | |
| 6,698,020 B1 | 2/2004 | Zigmond et al. | |
| 6,725,022 B1 | 4/2004 | Clayton et al. | |
| 6,748,237 B1 | 6/2004 | Bates et al. | |
| 6,799,201 B1 | 9/2004 | Lee et al. | |
| 6,813,501 B2 | 11/2004 | Kinnunen et al. | |
| 6,823,225 B1 | 11/2004 | Sass | |
| 6,832,102 B2 | 12/2004 | I'Anson | |
| 6,914,897 B1 | 7/2005 | Schuster et al. | |
| 6,947,396 B1 | 9/2005 | Salmi | |
| 6,950,623 B2 | 9/2005 | Brown et al. | |
| 6,952,559 B2 | 10/2005 | Bates et al. | |
| 7,003,478 B1 | 2/2006 | Choi | |
| 7,006,807 B2 | 2/2006 | Szczublewski et al. | |
| 7,065,333 B2 | 6/2006 | Engstrom | |
| 7,099,700 B2 | 8/2006 | Hwang et al. | |
| 7,107,063 B1 | 9/2006 | Bates et al. | |
| 7,146,578 B2 | 12/2006 | Kim | |
| 7,319,863 B2 | 1/2008 | Engstrom et al. | |
| 7,376,414 B2 | 5/2008 | Engstrom | |
| 7,433,922 B2 | 10/2008 | Engstrom | |
| 2001/0005834 A1 | 6/2001 | Simpson | |
| 2001/0019952 A1* | 9/2001 | Ishida | 455/414 |
| 2001/0037240 A1 | 11/2001 | Marks et al. | |
| 2002/0006793 A1 | 1/2002 | Kun-Szabo et al. | |
| 2002/0019776 A1 | 2/2002 | Simpson | |
| 2002/0026500 A1 | 2/2002 | Kanefsky et al. | |
| 2002/0029166 A1 | 3/2002 | Jacobs et al. | |
| 2002/0035605 A1 | 3/2002 | McDowell et al. | |
| 2002/0055926 A1 | 5/2002 | Dan et al. | |
| 2002/0056123 A1 | 5/2002 | Liwerant et al. | |
| 2002/0062251 A1 | 5/2002 | Anandan et al. | |
| 2002/0072341 A1 | 6/2002 | Ricard et al. | |
| 2002/0073044 A1 | 6/2002 | Singhal | |
| 2002/0077083 A1 | 6/2002 | Zellner et al. | |
| 2002/0107027 A1 | 8/2002 | O'Neil | |
| 2002/0122410 A1 | 9/2002 | Kulikov et al. | |
| 2002/0123356 A1 | 9/2002 | Michaud et al. | |
| 2002/0128908 A1 | 9/2002 | Levin et al. | |
| 2002/0156833 A1 | 10/2002 | Maurya et al. | |
| 2002/0184318 A1 | 12/2002 | Pineau | |
| 2003/0009772 A1 | 1/2003 | Karr | |
| 2004/0046637 A1 | 3/2004 | Wesby Van Swaay | |
| 2004/0052504 A1 | 3/2004 | Yamada et al. | |
| 2004/0171376 A1 | 9/2004 | Engstrom et al. | |
| 2005/0215238 A1 | 9/2005 | Macaluso | |
| 2005/0239448 A1 | 10/2005 | Bayne | |
| 2005/0246752 A1 | 11/2005 | Liwerant et al. | |
| 2007/0099701 A1 | 5/2007 | Simon et al. | |
| 2007/0105627 A1* | 5/2007 | Campbell | 463/40 |
| 2007/0124762 A1 | 5/2007 | Chickering et al. | |
| 2007/0184820 A1 | 8/2007 | Marshall | |
| 2007/0283384 A1 | 12/2007 | Haeuser et al. | |
| 2008/0227435 A1* | 9/2008 | Six et al. | 455/414.1 |

FOREIGN PATENT DOCUMENTS

| | | |
|---|---|---|
| WO | 02093761 | 11/2002 |
| WO | 02093800 | 11/2002 |
| WO | 02093875 | 11/2002 |

OTHER PUBLICATIONS

International Preliminary Examination Report for Application No. PCT/US02/14594, mailed Sep. 2, 2003.
International Search Report for Application No. PCT/US02/14872, mailed Jul. 31, 2002.
International Preliminary Examination Report for Application No. PCT/US02/14872, mailed Aug. 26, 2003.
International Search Report for Application No. PCT/US02/14908, mailed Sep. 9, 2002.
International Preliminary Examination Report for Application No. PCT/US02/14908, mailed Aug. 8, 2008.
International Search Report for Application No. PCT/US02/14909, mailed Sep. 25, 2002.
International Preliminary Examination Report for Application No. PCT/US02/14909, mailed May 20, 2003.
International Search Report for Application No. PCT/US02/14912, mailed Dec. 12, 2002.
International Preliminary Examination Report for Application No. PCT/US02/14912, mailed Nov. 5, 2003.

* cited by examiner

METHOD AND SYSTEMS FOR GENERATING AND SENDING A HOT LINK ASSOCIATED WITH A USER INTERFACE TO A DEVICE

RELATED APPLICATION

This application is a continuation of U.S. patent application Ser. No. 10/477,046, filed Nov. 7, 2003, which was the National Stage of International Application No. PCT/US2002/014909, filed on May 10, 2002, which itself claims the benefit of U.S. Provisional Application No. 60/290,592, filed May 11, 2001, the entire content and disclosure of which are hereby incorporated by references of its entirety.

FIELD OF THE INVENTION

The present invention relates to mobile telecommunication devices, and more specifically to sending a hot link that is associated with a user interface to a device.

BACKGROUND OF THE INVENTION

Since their introduction, the number of services and features for cellular telephones has steadily increased while the cost of ownership and operation has decreased. At first, these mobile telecommunication devices operated on analog wireless networks that enabled voice communication and simple paging features. Later, digital wireless networks were introduced for cellular telephones to provide more advanced features for voice and data communication, such as encryption, caller identification and sending and receiving short message service (SMS) text messages. More recently, some cellular telephones enable the browsing of web pages on the Internet or other on-line services.

The functionality of cellular telephones continues to increase. Some cellular telephones incorporate many of the features originally provided for in handheld electronic devices, such as personal digital assistants (PDAs). Relatively simple PDA features such as keeping a list of contacts, a calendar, appointments, and the like have been generally integrated into recent cellular telephone models.

The lower cost of ownership, along with the increased services and features available, has made it common for individuals to own a cellular telephone and use it for daily communications. Individuals are no longer restricting the use of their cellular telephone to strictly business or emergency calls. They are talking with their friends about what they are currently listening to on the radio, watching on television, viewing on the World Wide Web, and the like. The user may want their friends to listen to the same radio or television broadcast they are experiencing, or view the same website they think is interesting. However, cellular telephones do not provide this ability. Instead, a cellular telephone user has to manually change the settings or configuration of their phone, or some other device, in order to participate with their friends in the desired activity.

SUMMARY OF THE INVENTION

The invention relates to providing a method and system for generating and sending a hot link to a device. The hot link contains an action that instructs the receiving device to perform some activity when an associated user interface is selected.

According to one aspect of the invention, a mobile device is configured to generate and send a hot link to another device. The hot link may direct the device receiving the hot link to perform some action. For example, the action contained within the hot link may instruct the receiving device to tune a receiver to a particular broadcast, dial a number, respond to message, and the like.

According to another aspect of the invention, the hot link is associated with a user interface. When the user interface is selected the hot link action is performed. The user interface may be a physical button or a virtual button, icon, symbol, or some other user interface associated with the device receiving the hot link. The user interface may be a predetermined button on the device. For example, the * key on a device may be the predetermined button.

According to yet another aspect of the invention, a message that includes the hot link is generated and sent to the device. The message may be generated by the mobile device or may be generated by an external computer, such as a server. The message is sent using an appropriate message protocol for the receiving device. For example, the message may be sent to a mobile device using the SMS protocol.

According to still yet another aspect of the invention, the message includes an identification field that corresponds to the message delivered to the user of the device when the message is received. For example, the identification field could simply be a text statement such as: "Do you want to view HBO now?"

According to another aspect of the invention, the message contains a field that identifies the type of hot link contained within the message. Character codes are used to indicate the type of hot link. For example, the character code "!RS**" may be used to indicate that the type of action is a broadcast action that instructs the device to change a tuner to a radio station using the characters supplied in the wildcard pattern ***.

According to yet another aspect of the invention, the hot link may be generated automatically based on the current configuration of the mobile device or selected manually. For example, when the user is listening to a radio station, a hot link is generated instructing a device to change to the radio station currently on the user's device. The user may also select the hot link from a list of available hot links.

According to still yet another aspect of the invention, the selection of devices that are to receive the hot link may be manually or automatically generated. The user may select each device manually, or the selection may be based on a user's preferences, such as the preferences found in a PAL list.

These and various other features as well as advantages, which characterize the present invention, will be apparent from a reading of the following detailed description and a review of the associated drawings.

DETAILED DESCRIPTION OF THE PREFERRED EMBODIMENT

Figure 1:
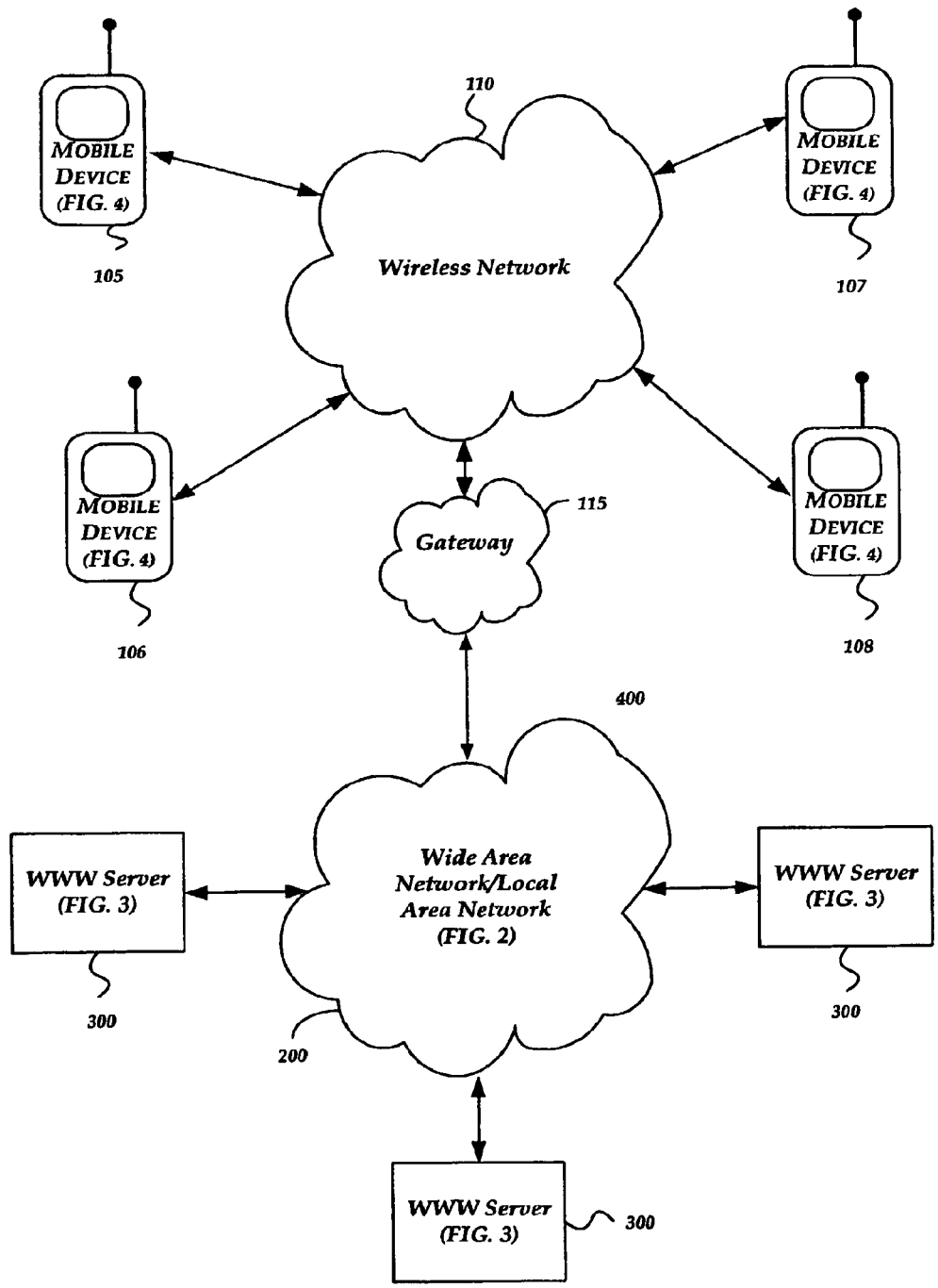
FIG. 1 is a schematic diagram that shows an exemplary system overview.

In the following detailed description of exemplary embodiments of the invention, reference is made to the accompanied drawings, which form a part hereof, and which is shown by way of illustration, specific exemplary embodiments of which the invention may be practiced. Each embodiment is described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The term "a broadcast spectrum" means any portion or portions of the range of frequencies, channels, or Internet addresses employed for broadcasting that are selected for tuning in conjunction with the practice of the invention disclosed herein. The term "broadcast" includes but is not limited to commercial radio and television stations, Internet radio and the like. The term "user preference" can include a plurality of elements. For example, a user preference for disco music circa 1980 has at least two elements, i.e., the type of music and the era. The term "user interface" can include any type of element that is selectable on a device, including, but not limited to, push-button, rocker switch, slider, dial, key, mouse, pointer, touch-sensitive pad, touch sensitive screen, and soft key.

Referring to the drawings, like numbers indicate like parts throughout the views. Additionally, a reference to the singular includes a reference to the plural unless otherwise stated or is inconsistent with the disclosure herein.

Briefly described, the present invention is directed to generating and sending a hot link to a telecommunications device. The hot link is associated with an action that can be performed by the receiving device. The hot link may be associated with a user interface that when selected activates the hot link. Alternatively, the action may automatically be performed when the hot link and the associated action are received. For example, a hot link may be associated with an action to call another user upon activation of a user interface, or when the hot link is received by the device, automatically performing the associated action.

With reference to FIG. 1, an exemplary system in which the invention operates includes wireless mobile devices 105-108, wireless network 110, gateway 115, wide area network (WAN)/local area network (LAN) 200 and one or more world wide web (WWW) servers 300.

Figure 4:
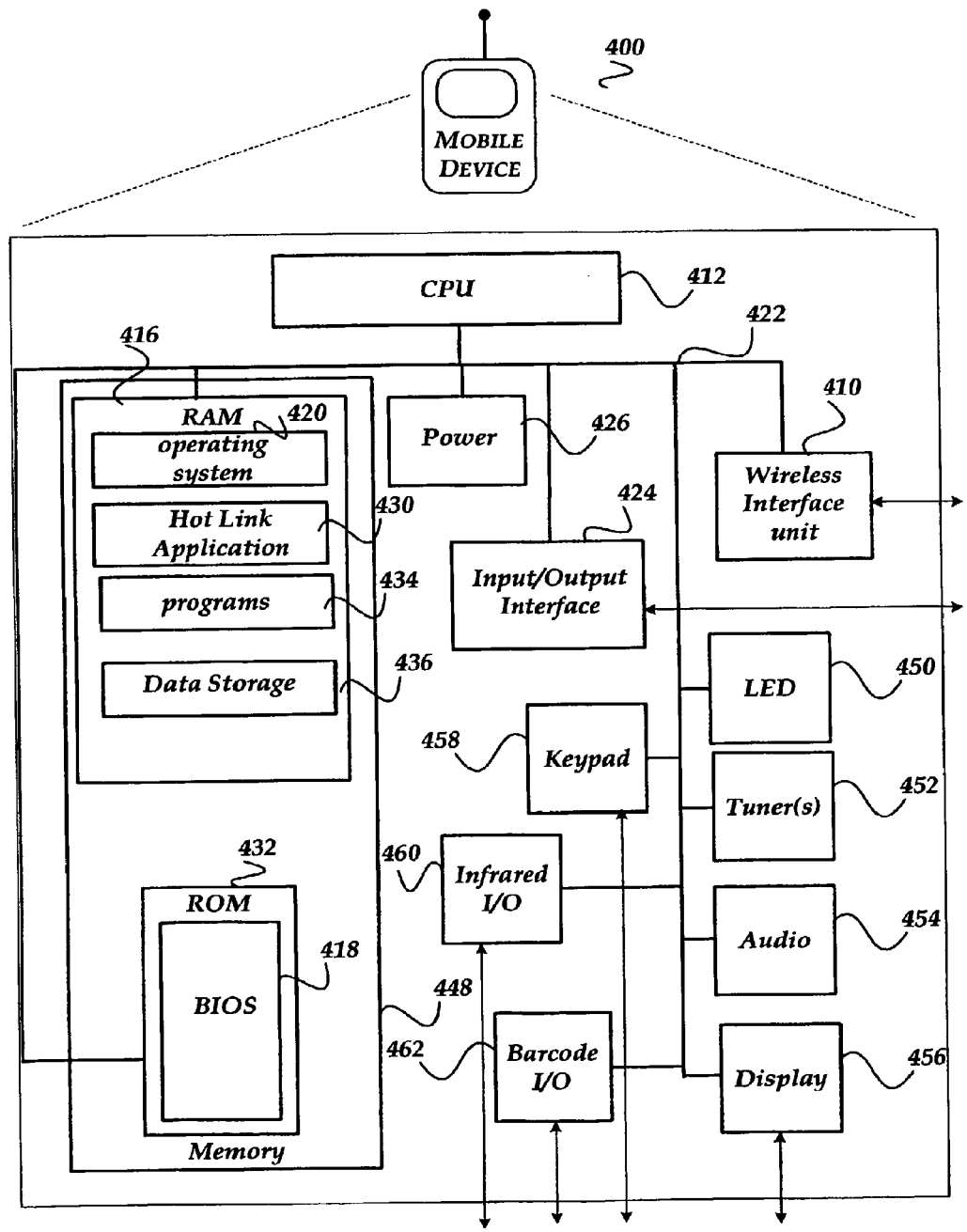
FIG. 4 is a schematic diagram that illustrates an exemplary mobile device.
Figure 5:
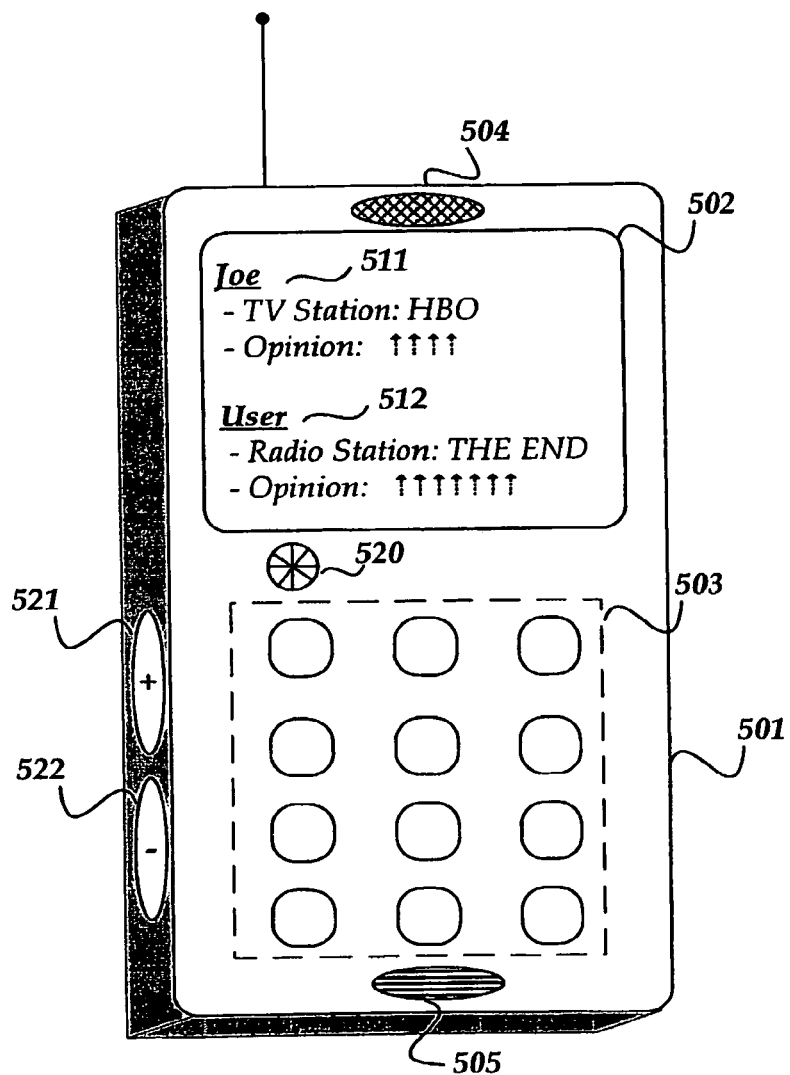
FIG. 5 illustrates another exemplary embodiment of a mobile device for generating, sending and receiving hot links.

Wireless devices 105-108 are coupled to wireless network 110 and are described in more detail in conjunction with FIG. 4 and FIG. 5. Generally, mobile devices 105-108 include any device capable of connecting to a wireless network such as wireless network 110. Such devices include cellular telephones, smart phones, pagers, radio frequency (RF) devices, infrared (IR) devices, citizen band radios (CBs), integrated devices combining one or more of the preceding devices, and the like. Mobile devices 105-108 may also include other devices that have a wireless interface such as PDAs, handheld computers, personal computers, multiprocessor systems, microprocessor-based or programmable consumer electronics, network PCs, wearable computers, and the like.

Wireless network 110 transports information to and from devices capable of wireless communication, such as mobile devices 105-108. Wireless network 110 may include both wireless and wired components. For example, wireless network 110 may include a cellular tower that is linked to a wired telephone network. Typically, the cellular tower carries communication to and from cell phones, pagers, and other wireless devices, and the wired telephone network carries communication to regular phones, long-distance communication links, and the like.

Wireless network 110 is coupled to WAN/LAN through gateway 115. Gateway 115 routes information between wireless network 110 and WAN/LAN 200. For example, a user using a wireless device may browse the Internet by calling a certain number or tuning to a particular frequency. Upon receipt of the number, wireless network 110 is configured to pass information between the wireless device and gateway 115. Gateway 115 may translate requests for web pages from wireless devices to hypertext transfer protocol (HTTP) messages, which may then be sent to WAN/LAN 200. Gateway 115 may then translate responses to such messages into a form compatible with the requesting device. Gateway 115 may also transform other messages sent from wireless devices 105-108 into information suitable for WAN/LAN 200, such as e-mail, audio, voice communication, contact databases, calendars, appointments, and the like.

Figure 2:
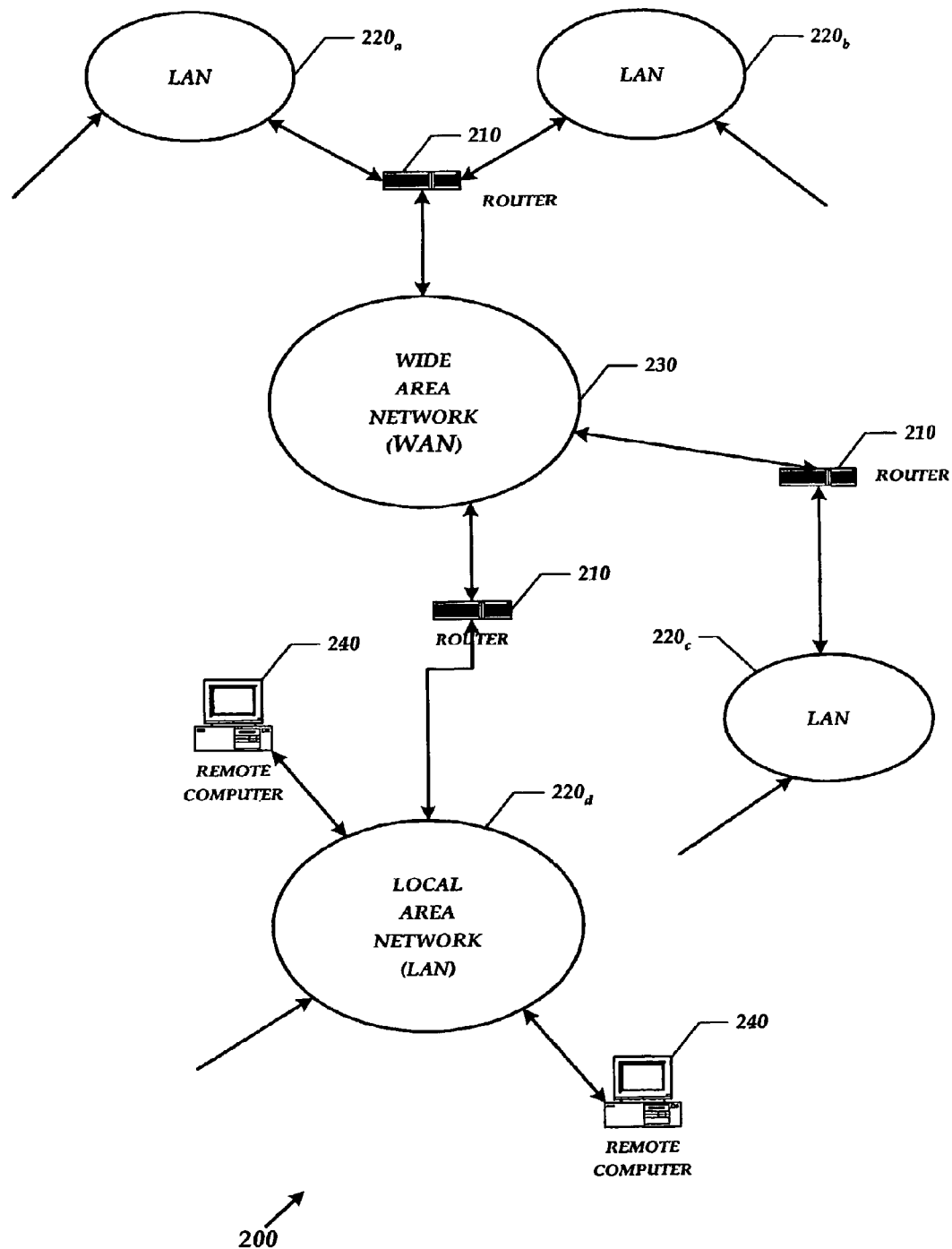
FIG. 2 is a schematic diagram that illustrates an exemplary system overview in which local area networks and a wide area network are interconnected by routers.

Typically, WAN/LAN 200 transmits information between computing devices as described in more detail in conjunction with FIG. 2. One example of a WAN is the Internet, which connects millions of computers over a host of gateways, routers, switches, hubs, and the like. An example of a LAN is a network used to connect computers in a single office. A WAN may connect multiple LANs.

WWW servers 300 are coupled to WAN/LAN 200 through communication mediums. WWW servers 300 provide access to information and services as described in more detail in conjunction with FIG. 3.

FIG. 2 shows another exemplary system in which the invention operates in which a number of local area networks ("LANs") 220$_{a-d}$ and wide area network ("WAN") 230 interconnected by routers 210. Routers 210 are intermediary devices on a communications network that expedite message delivery. On a single network linking many computers through a mesh of possible connections, a router receives transmitted messages and forwards them to their correct destinations over available routes. On an interconnected set of LANs—including those based on differing architectures and protocols—, a router acts as a link between LANs, enabling messages to be sent from one to another. Communication links within LANs typically include twisted wire pair, fiber optics, or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links, or other communications links known to those skilled in the art. Furthermore, computers, such as remote computer 240, and other related electronic devices can be remotely connected to either LANs $220_{a-d}$ or WAN 230 via a modem and temporary telephone link. The number of WANs, LANs, and routers in FIG. 2 may be increased or decreased without departing from the spirit or scope of this invention. As such, it will be appreciated that the Internet itself may be formed from a vast number of such interconnected networks, computers, and routers and that an embodiment of the invention could be practiced over the Internet without departing from the spirit and scope of the invention.

The media used to transmit information in communication links as described above illustrates one type of computer-readable media, namely communication media. Generally, computer-readable media includes any media that can be accessed by a computing device. Computer-readable media may include computer storage media, communication media, or any combination thereof.

Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, communication media includes wired media such as twisted pair, coaxial cable, fiber optics, wave guides, and other wired media and wireless media such as acoustic, RF, infrared, and other wireless media.

The Internet has recently seen explosive growth by virtue of its ability to link computers located throughout the world. As the Internet has grown, so has the WWW. Generally, the WWW is the total set of interlinked hypertext documents residing on HTTP servers around the world. Documents on the WWW, called pages or Web pages, are typically written in HTML (Hypertext Markup Language) or some other markup language, identified by URLs (Uniform Resource Locators) that specify the particular machine and pathname by which a file can be accessed, and transmitted from server to end user using HTTP. Codes, called tags, embedded in an HTML document associate particular words and images in the document with URLs so that a user can access another file, which may literally be halfway around the world, at the press of a key or the click of a mouse. These files may contain text (in a variety of fonts and styles), graphics images, movie files, media clips, and sounds as well as Java applets, ActiveX controls, or other embedded software programs that execute when the user activates them. A user visiting a Web page also may be able to download files from an FTP site and send messages to other users via email by using links on the Web page.

Figure 3:
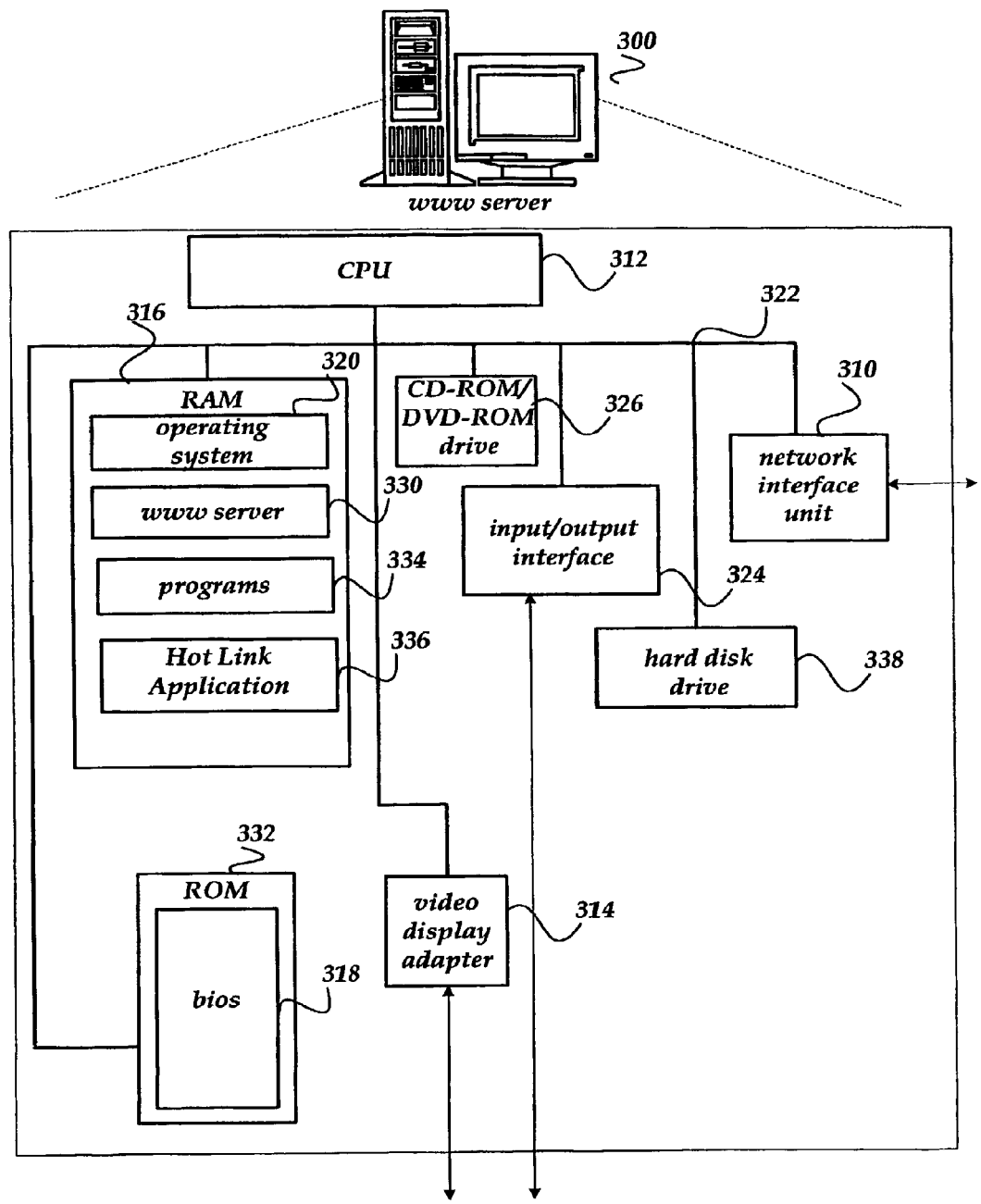
FIG. 3 is a schematic diagram that shows an exemplary server.

A WWW server, as described in more detail in conjunction with FIG. 3, is a computer connected to a network having storage facilities for storing hypertext documents for a WWW site and running administrative software for handling requests for the stored hypertext documents. A hypertext document normally includes a number of hyperlinks, i.e., highlighted portions of text which link the document to another hypertext document possibly stored at a WWW site elsewhere on the Internet. Each hyperlink is associated with a URL that provides the location of the linked document on a server connected to the Internet and describes the document. Thus, whenever a hypertext document is retrieved from any WWW server, the document is considered to be retrieved from the WWW. As is known to those skilled in the art, a WWW server may also include facilities for storing and transmitting application programs, such as application programs written in the JAVA programming language from Sun Microsystems, for execution on a remote computer. Likewise, a WWW server may also include facilities for executing scripts and other application programs on the WWW server itself.

A user may retrieve hypertext documents from the WWW via a WWW browser application program located on a wired or wireless device. A WWW browser, such as Netscape's NAVIGATOR® or Microsoft's INTERNET EXPLORER®, is a software application program for providing a graphical user interface to the WWW. Upon request from the user via the WWW browser, the WWW browser accesses and retrieves the desired hypertext document from the appropriate WWW server using the URL for the document and HTTP. HTTP is a higher-level protocol than TCP/IP and is designed specifically for the requirements of the WWW. HTTP is used to carry requests from a browser to a Web server and to transport pages from Web servers back to the requesting browser or client. The WWW browser may also retrieve application programs from the WWW server, such as JAVA applets, for execution on a client computer.

FIG. 3 shows an exemplary WWW server 300 that is operative to provide a WWW site. Accordingly, WWW server 300 transmits WWW pages to the WWW browser application program executing on requesting devices to carry out this process. For instance, WWW server 300 may transmit pages and forms for receiving information about a user, such as user preferences, address, telephone number, billing information, credit card numbers, and the like. Moreover, WWW server 300 may transmit WWW pages to a requesting device that allow a user to participate in a WWW site. WWW server 300 may also generate and send hot links to devices on a network. The transactions may take place over the Internet, WAN/LAN 200, or some other communications network known to those skilled in the art.

Those of ordinary skill in the art will appreciate that the WWW server 300 may include many more components than those shown in FIG. 3. However, the components shown are sufficient to disclose an illustrative embodiment for practicing the present invention. As shown in FIG. 3, WWW server 300 is connected to WAN/LAN 200, or other communications network, via network interface unit 310. Those of ordinary skill in the art will appreciate that network interface unit 310 includes the necessary circuitry for connecting WWW server 300 to WAN/LAN 200, and is constructed for use with various communication protocols including the TCP/IP protocol. Typically, network interface unit 310 is a card contained within WWW server 300.

WWW server 300 also includes processing unit 312, video display adapter 314, and a mass memory, all connected via bus 322. The mass memory generally includes RAM 316, ROM 332, and one or more permanent mass storage devices, such as hard disk drive 328, a tape drive, CD-ROM/DVD-ROM drive 326, and/or a floppy disk drive. The mass memory stores operating system 320 for controlling the operation of WWW server 300. It will be appreciated that this component may comprise a general purpose server operating system as is known to those of ordinary skill in the art, such as UNIX, LINUX™, or Microsoft WINDOWS NT®. Basic input/output system ("BIOS") 318 is also provided for controlling the low-level operation of WWW server 300.

The mass memory as described above illustrates another type of computer-readable media, namely non-transitory computer storage media. Non-transitory computer storage media may include volatile and nonvolatile, removable and non-removable media implemented in any method or technology for storage of information, such as computer readable instructions, data structures, program modules or other data.

Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other non-transitory medium which can be used to store the desired information and which can be accessed by a computing device.

The mass memory also stores program code and data for providing a WWW site. More specifically, the mass memory stores applications including WWW server application program 330, programs 334, and hot link application 336. Generally, hot link application 336 may generated and send messages containing hot links to other devices. The hot link contains an action that instructs the receiving device to perform some action upon activation of the hot link (See figures and related discussion below). WWW server application program 330 includes computer executable instructions which, when executed by WWW server computer 300, generate WWW browser displays, including performing the logic described above. WWW server 300 may include a JAVA virtual machine, an SMTP handler application for transmitting and receiving email, an HTTP handler application for receiving and handing HTTP requests, JAVA applets for transmission to a WWW browser executing on a client computer, and an HTTPS handler application for handling secure connections. The HTTPS handler application may be used for communication with external security applications (not shown), to send and receive private information in a secure fashion.

WWW server 300 also comprises input/output interface 324 for communicating with external devices, such as a mouse, keyboard, scanner, or other input devices not shown in FIG. 3. Likewise, WWW server 300 may further comprise additional mass storage facilities such as CD-ROM/DVD-ROM drive 326 and hard disk drive 328. Hard disk drive 328 is utilized by WWW server 300 to store, among other things, application programs, databases, and program data used by WWW server application program 330, and hot link application 336. For example, customer databases, product databases, image databases, and relational databases may be stored. The operation and implementation of these databases is well known to those skilled in the art.

FIG. 4 shows an exemplary mobile device 400, according to one embodiment of the invention. Mobile device 400 may be arranged to transmit and receive data. For instance, mobile device 400 may send and receive messages from other mobile devices and servers as well as receiving broadcasts. For example, mobile device 400 may receive SMS messages containing a hot link. The data transmissions may take place over the Internet, WAN/LAN 200, or some other communications network known to those skilled in the art.

Those of ordinary skill in the art will appreciate that mobile device 400 may include many more components than those shown in FIG. 4. However, the components shown are sufficient to disclose an illustrative embodiment for practicing the present invention. As shown in the figure, mobile device 400 includes processing unit 412, memory 448, RAM 416, ROM 432, operating system 420, application 430, programs 434, data storage 436, bios 418, power 426, input/output interface 424, wireless interface unit 410, LED 450, tuner(s) 452, audio 454, display 456, keypad 458, infrared input/output 460, and barcode input/output 462.

Mobile device 400 may connect to WAN/LAN 200, or other communications network, via wireless interface unit 410. Those of ordinary skill in the art will appreciate that wireless interface unit 410 includes the necessary circuitry for connecting mobile device 400 to WAN/LAN 200, and is constructed for use with various communication protocols including the TCP/IP protocol. Wireless interface unit 410 may include a radio layer (not shown) that is arranged to transmit and receive radio frequency communications. Wireless interface unit 410 connects mobile device 400 to external devices, via a communications carrier or service provider.

Mass memory 448 generally includes RAM 416, ROM 432, and one or more data storage units 436. The mass memory stores operating system 420 for controlling the operation of mobile device 400. It will be appreciated that this component may comprise a general purpose server operating system as is known to those of ordinary skill in the art, such as a version of UNIX, LINUX™, or Microsoft WINDOWS®. Basic input/output system ("BIOS") 418 is also provided for controlling the low-level operation of mobile device 400.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data used within mobile device 400. More specifically, the mass memory stores applications including opinion application 430, and programs 434. Programs 434 may include computer executable instructions which, when executed by mobile device 400, transmit and receive hot links, WWW pages, e-mail, audio, video, and the like. One or more programs 434 may be loaded into memory 448 and run under control of operating system 420. Hot link application 430 performs the methods described below. Generally, hot link application 430 may generate, send and receive hot links. When hot link application 430 receives a hot link, the action corresponding to the hot link is associated with a user interface on mobile device 400. The user interface may be a physical button or a virtual button. When hot link application 430 sends a hot link, a message is formed containing the hot link and instructions relating to the action associated with the hot link. Examples of application programs include radio tuner programs, phone programs, communication programs, productivity programs (word processing, spreadsheet, etc.), browser programs, and the like. Mobile computing device 400 also includes ROM 432. ROM 432 may be used to store data that should not be lost when mobile device 400 loses power.

Mobile device 400 also comprises input/output interface 424 for communicating with external devices, such as a headset, or other input or output devices not shown in FIG. 4. Data storage 436 is utilized by mobile device 400 to store, among other things, application programs, databases, and program data used by the mobile device broadcast delivery application. For example, user databases, product databases, image databases, and relational databases may be stored. The operation and implementation of these databases is well known to those skilled in the art.

Keypad 458 may be any input device arranged to receive inputs from a user. For example, keypad 458 may be a push button numeric dialing, or a keyboard. Display 456 may be a liquid crystal display, or any other type of display commonly used in mobile devices. Keypad 458 may also include a button that is associated with hot links. Display 456 may also be a touch screen arranged to receive a users inputs. Infrared input/output 460 may be used to send and receive infrared commands to/from other devices. Barcode input/output 462 may be used in a manner consistent with barcode readers. For example, barcode input/output 462 may be used to scan and identify items including a barcode.

Power supply 426 provides power to mobile device 400. According to one embodiment, a rechargeable battery provides power. The power may be also be provided by an external power source, such as an AC adapter or a powered docking cradle that supplements or recharges the battery.

As shown, mobile device 400 includes light emitting diode (LED) display 450, tuner(s) 452, and audio interface 454. LED display 450 may be controlled to remain active for specific periods or events. For example, an LED display may stay on while the phone is powered or may light up in various patterns. The patterns may be a predetermined or random pattern. Audio interface 454 is arranged to receive and provide audio signals. For example, audio interface 454 may be coupled to a speaker (not shown) to provide audio from a telephone call, tuner(s) 452, or from some other audio source. Audio interface 454 may also be coupled to an input device, such as a microphone, to receive audio input. Tuner(s) 452 may be any tuner to receive a broadcast. For example, tuner(s) 452 may be an AM tuner, an FM tuner, an AM/FM tuner, an Internet radio tuner, a television tuner, and the like.

FIG. 5 illustrates another exemplary embodiment of a mobile device for generating, sending and receiving hot links, according to one embodiment of the invention. Mobile device 501 appears as a typical cellular telephone having a display 502 and a set of 12 input keys 503 that form a telephone keypad. Mobile device 501 possesses one or more audio speakers 504 for generating audio data for users and an audio input microphone 505 for accepting audio input data from users. Devices 502-505 may be used when mobile device 501 operates as a telephone as well as when mobile device 501 receives data such as broadcast data or Internet data for display. One skilled in the art will also recognize that these devices may be implemented using external headphones and microphones.

Mobile device 501 also possesses three additional input buttons: command button 520, positive opinion button 521 and negative opinion button 522. Command button 520 is one type of user interface that may be associated with a hot link. When command button 520 is activated, an action corresponding to a hot link is performed. Command button 520 may be selected to send a hot link to another device, or perform an action associated with a received hot link. Command button 520 may be associated with any information that instructs mobile device 501 to perform some action.

Positive opinion button 521 and negative opinion button 522 provide a simple mechanism for permitting a user to input positive and negative opinion about an item. For example, an item may be a current song playing on the mobile device. The user may depress positive opinion button 521 one or more times to provide an indication of his or her positive opinion of the song. This opinion information may be transmitted to a central database on a web server, along with identifying information about the item. A user may generate and transmit similar information indicating a negative opinion of the item, as well as the degree of the negative opinion about the item, by using negative opinion button 522 in the same manner as positive opinion button 521.

A user may set up a preference list that automatically sends a hot link to a predetermined list of users based on their opinion of an item. For example, a user may set up a preference to send a hot link to a group of users to tune to a particular radio station, based on their level of opinion of the song playing on the station. For example, the user may set up a preference list that automatically sends a hot link containing an action instructing the device to tune to a radio station when the level opinion for an item exceeds seven (7) on a scale of one (1) to ten (10). Alternatively, the user may use command button 520 to send a hot link to another device or group of devices.

The device's display 502 may also provide data associated with a PAL LIST of other users of similar mobile devices. The PAL LIST may include one or more entries for friends of the user. This list is similar to a friends or buddy list that may be part of instant messaging systems operating over the Internet. For each member of the PAL LIST, a set of status data for the individual user may be displayed. This status data may include an indication of the user's location, an indication of the broadcast station currently being played (if any), and any current aggregated opinion data. For example, an entry for "Joe" 511 indicates that he is watching television station identified as "HBO" and he has currently provided four (4) positive opinions for the show he is currently viewing. User 512 is the current user of mobile device 501. Currently, user 512 is online and is listening to radio station identified as "THE END" and has provided seven (7) positive opinions for the song currently playing. According to one embodiment of the invention, user 512 may select command button 520 to send a hot link to another device. For example, according to the present example, a hot link may be sent to "Joe" that includes instructions to tune Joe's device to "THE END" when he activates the hot link by selecting a user interface. As will be appreciated, the hot link may be associated with any action performable by the device receiving the hot link. The actions performable vary by the functionality provided by the receiving device. For example, a mobile device will typically have some functionality that is different than a personal computer.

The PAL LIST mechanism includes a feature in which a particular user must "opt-in" or affirmatively agree to provide this status data to a requesting user of another mobile device 501 before the web server will share this data. The members of the PAL LIST may remove any previously granted permission to receive status data from a first user to block a second user from receiving information about the first user. As such, no user of the mobile devices will have status data shared with other individuals without their approval.

In various embodiments, the mobile device may be a selected one of a wireless mobile phone, a pager, a personal digital assistant (PDA), a palm-sized computing device, a laptop computer, a portable radio, a portable MPx player, and a portable CD/DVD player.

Figure 6:
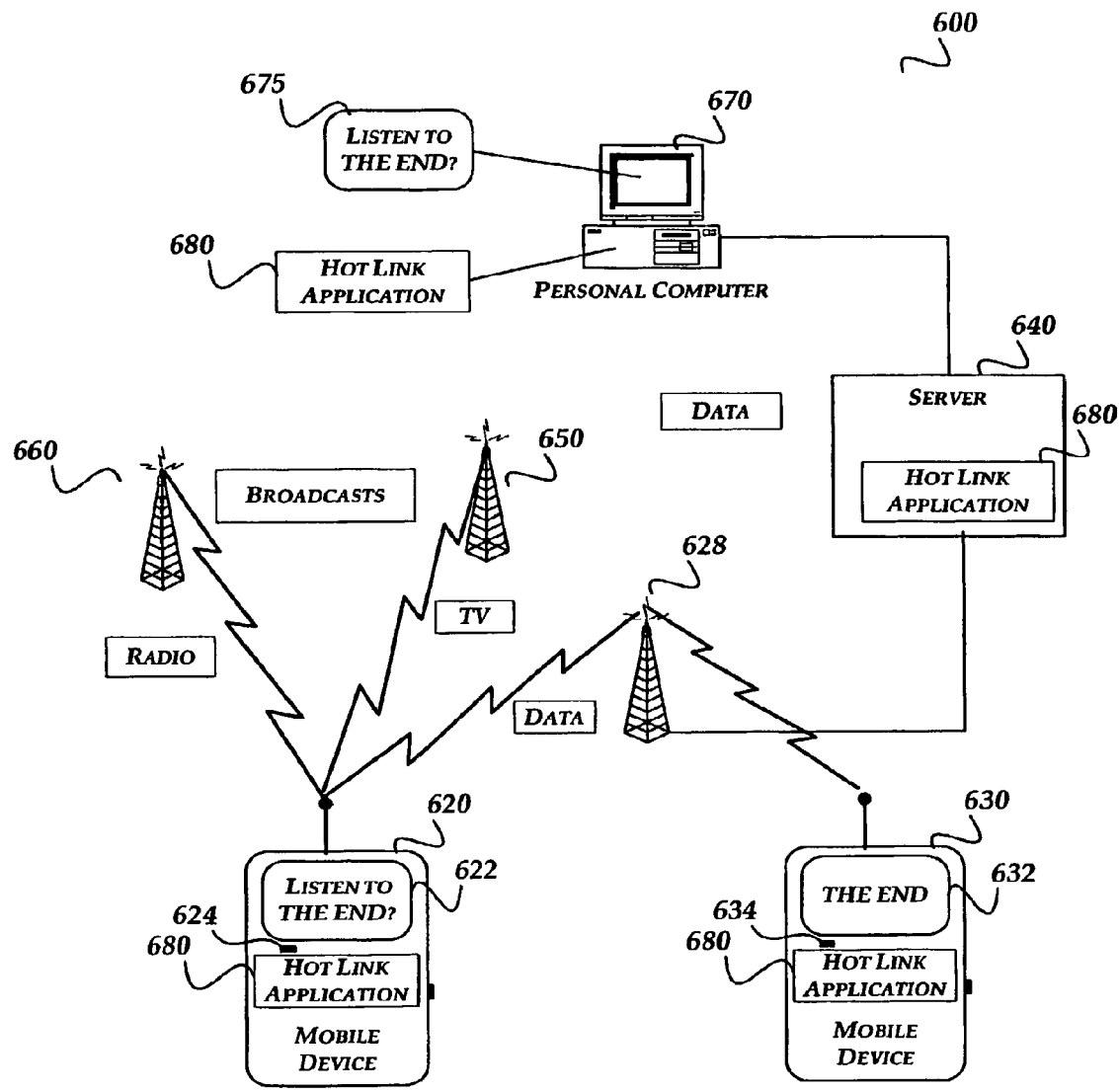
FIG. 6 shows a functional block diagram of a hot link transfer system utilizing a server and mobile devices.

FIG. 6 shows a functional block diagram of a hot link transfer system utilizing a server and mobile devices, in accordance with the present invention. As shown in the figure, hot link transfer system 600 includes personal computer 670, mobile device 620, mobile device 630, radio broadcast 660, TV broadcast 650, and data broadcast 626. Personal computer 670 includes display 675 and hot link application 680. Server 640 includes hot link application 680. Mobile device 620 includes display 622, command button 624, and hot link application 680. Mobile device 630 includes display 632, command button 634, and hot link application 680.

In this implementation, server 640 is a computing device such as the one described above in conjunction with FIG. 3, and mobile devices 620 and 630 are mobile computing devices such as the ones described above in conjunction with FIG. 4 or FIG. 5. Hot link application 680 may generate hot links, send hot links, and receive hot links to/from other devices. Server 640 may route hot links to other devices, as well as be programmed to automatically generate hot links and send them to requesting devices. For example, server hot link application 680 may generate hot links for a user based on their user preferences. One particular example would include when a user desires to have a hot link sent to his device when a certain song is playing. When the song is playing, server hot link application 680 may send a hot link instructing the user's device to receive the broadcast of the song when the command button is activated. The server may access a remote data source to identify the songs that are currently being played. For example, songlist information is typically available from CLEAR CHANNEL. Hot link application 680 may generate a message format using a specified protocol for each type of device receiving the hot link. For example, hot link application 680 may generate an SMS message containing the hot link for a mobile device, or a hot link containing java script for other devices.

An illustrative example will now be described. As illustrated on display 632, the user of mobile device 630 is listening to "THE END." According to this example, the user of mobile device 630 desires to send a hot link to the users of mobile device 620 and personal computer 670 that will tune their devices to the broadcast identified by "THE END" when they select a command button on their device. To transfer the hot link, the user of mobile device 630 may select command button 634, or some other user interface such as a physical or virtual button on mobile device 630. In response to the selection of a user interface, mobile device's 630 hot link application 680 generates the message containing the hot link and sends the message to the other devices. Alternatively, hot link application 680 or mobile device 630 may send a message to server 640 indicating the hot link to generate and the devices to receive the hot link. When the hot link is sent to mobile device 620 and personal computer 670, the user of the device is notified of the received hot link. One method of notification is delivering a visual indication to the user on the device's display. According to the present example, the message "Listen, to THE END?" is shown on display 622 of mobile device 620 as well as on display 675 of personal computer 670. The user may also be notified by some other method, including an audio notification, or some other type of visual notification. As will be appreciated, many types of messages may be generated notifying the user of the received hot link. The user of device 620 and personal computer 670 may decide whether or not to activate the hot link. If the user desires to activate the hot link, the user selects the command button and the device is tuned to "THE END."

Figure 7:
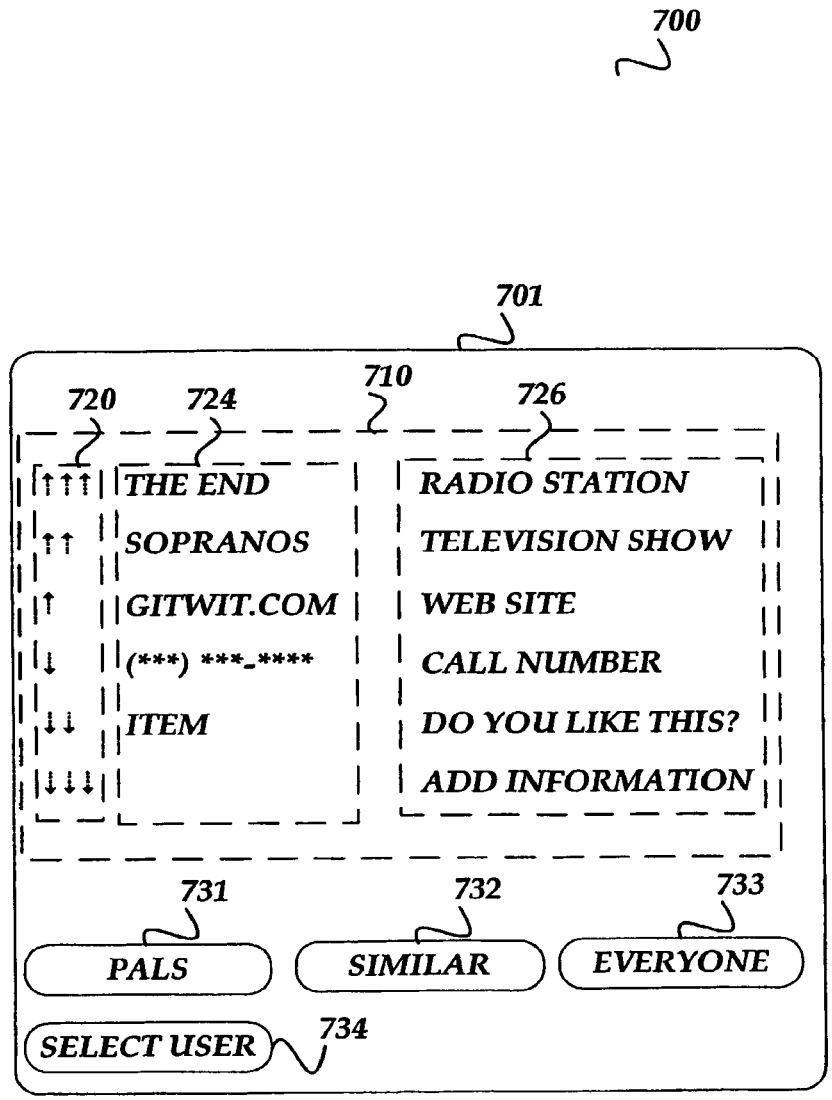
FIG. 7 illustrates an exemplary display for selecting the action associated with the hot link.

FIG. 7 illustrates an exemplary display for selecting the action associated with the hot link, according to one embodiment of the invention. As shown in the figure, hot link action selection system 700, includes display 701, hot link items 710, PALS button 731, SIMILAR button 732, EVERYONE button 733, and SELECT USER button 734. Hot link items 710 include opinion indicators 720, titles 724, and descriptions 726.

Hot link items 710 contain a set of actions that may be used to generate a hot link. Display 701 may contain titles 724 identifying the action, as well as descriptions 726 of the action. The title may be the broadcast name, item, song name, movie, product number, and the like. Display 701 may also provide a visual representation of the number of users who have provided positive and negative opinions corresponding to the action.

Display 701 also shows levels 720 of the user opinions. Levels 720 indicate the level of the positive or negative opinion expressed by a particular user or group of users. The group of users may be the users within the PAL list specified by the user, or some other list. The opinion data may be used in many different ways. For example, the opinion data may be used to help select the action to be associated with the hot link. For example, when the action item has been given a negative opinion, the user may decide not to select the action to associate with a hot link. When the opinions are positive for an item, however, the user may select the action to be associated with the hot link. For example, the user may decide to select an action relating to the radio station "THE END" since the opinion level is positive.

Display 701 may also provide mechanisms, such as buttons 731-734 to indicate which groups should receive the hot link. For example, PALS button 731 may indicate to send the hot link to other users found on their PAL LIST. SIMILAR button 732 may be used to send the hot link to only those people whose opinions are similar to their own. For example, the similar individuals may be generated based on the users previous opinions expressed and compared with other similar users who have expressed opinions in the system. Similarly, an EVERYONE button 733 may be used to send the hot link to all devices. Select user button 734 may be used to select a particular user in which to send the hot link. Of course, any other groups of users may be generated automatically or manually. The groups may be generated based on a user's preferences, demographic data, and the like.

Figure 8:
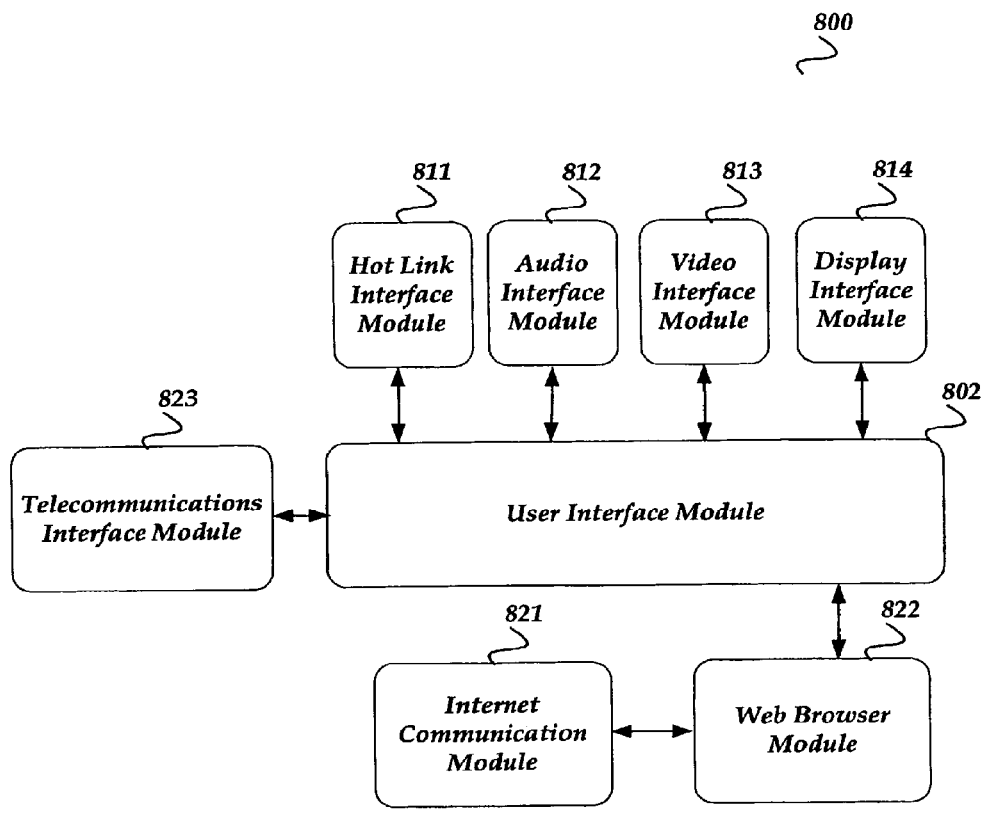
FIG. 8 illustrates a functional block diagram for a hot link system.

FIG. 8 illustrates a functional block diagram for a hot link system, according to one embodiment of the invention. As shown in the figure, hot link system 800 includes user interface module 802, that interacts with the user of the device through the a set of modules. These modules include hot link interface module 811, audio interface module 812, video interface module 813, display interface module 814, Internet communication module 821, web browser module 822, and telecommunications interface module 823.

Hot link interface module 811 generates, sends and receives hot links. Hot link interface module 811 interacts with the other interface modules to obtain the information used to generate and perform the action associated with the hot link. Hot link Interface module 811 may also generate a data message containing the hot link and generate instructions that instruct the device to send the hot link to other devices.

Audio interface module 812 processes the audio broadcast data received from all sources, including any broadcast tuners (not shown), web browser module 822, telecommunications interface module 823 and any other sources of audio data. Audio interface module 812 performs any processing necessary to format and decode any audio data so that it may be output to the user. This module may process audio data in any format including sampled analog data and encoded audio data as well as merely control the output of an analog signal received from the radio tuner. Audio interface module 812 may provide audio data to hot link interface 811 used in generation of the hot link. Audio interface module 812 may also receive tuning instructions from hot link interface 811 to tune to a particular broadcast.

Video interface module 813 processes video broadcast data received that is to be displayed as a rendered image on the mobile device's display. Video interface module 813 processes the data to display web pages rendered from a mark-up language such as HTML, static graphic images in any format, such as GIF, JPEG, TIFF, BMP, and similar representations of audio data, and video sequences of images such as streaming video, QUICKTIME movies, MPEG movies and similar representations of video data. Video interface module 813 may provide video data to hot link interface 811 used in generation of the hot link associated with video. Video interface module 813 may also receive tuning instructions from hot link interface 811 to tune to a particular broadcast.

Display interface module 814 processes any data that specifies how other display elements on the mobile device, such as the color, intensity and display characteristics of input buttons on the mobile device. As is discussed above, LEDs may be placed on the mobile device and display various patterns. For example, LEDs of various colors may be associated with input buttons. As such, display interface module 814 processes received data to illuminate various buttons as desired. Display interface module 814 may provide visual data to hot link interface 811 used in generation of the hot link associated with the display of the device. Display interface module 814 may also receive display instructions from hot link interface 811 to create a particular display in response to the performed hot link.

User interface module 802 interacts with the telecommunications interface module 823 to process any telephone call related operations of the device. Telecommunications interface module 833 may provide call data to hot link interface 811 used in generation of the hot link associated with telecommunications. Telecommunications interface module 833 may also receive calling instructions from hot link interface 811 to call to a particular telephone number.

User interface module 802 also interacts with web browser module 822 to receive, process and display Internet-related data. Broadcast related modules interact with user interface module 802 to receive and output radio related data to a user. Browser module 822 may provide browser data to hot link interface 811 used in generation of the hot link associated with browsing a Web site. Browser module 822 may also receive instructions from hot link interface 811 to retrieve or send information to/from a particular site.

Web browser module 822 communicates with web sites on the Internet through Internet communications module 821. Web browser module 822 receives the web page data and renders the image corresponding to the data and web pages that are displayed to the user. Internet communication module 821 performs the communications functions necessary to connect to the Internet as well as send and receive web page data that may be specified in a web page mark-up language such as HTML, WAP, or similar web page specification languages.

Figure 9:
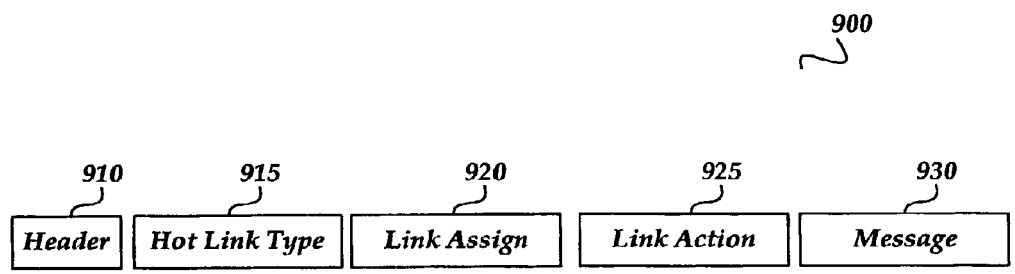
FIG. 9 illustrates an exemplary hot link message format.

FIG. 9 illustrates an exemplary hot link message format, in accordance with aspects of the invention. As shown in the figure, hot link message format 900 includes header 910, hot link type 915, link assign 920, link action 925, and message 930. The hot link message format is exemplary only and not intended to be limiting.

Header 910 is used to store routing information for the message. The header contains information relating to the location of the device that will receive the hot link. For example, the header may indicate the location of mobile device 620. According to another example, the header may indicate the location for the personal computer 670 (See FIG. 6 and related discussion).

Hot link type field 915 indicates the type of hot link is contained within the message. The hot link may be many different types, including, but not limited to: a broadcast type, a telecommunications type, a network type, a message type, a data type, and the like. The broadcast type indicates that the hot link is associated with a broadcast. For example, the hot link tunes the device to a particular broadcast station. A telecommunications type indicates that the hot link is associated with the telecommunications portion of the device. For example, the hot link is associated with calling a particular telephone number. A network type indicates that the hot link is associated with sending or retrieving information over a network, such as the Internet. A message type indicates that the hot link is a message to a device that requests a response. For example, the message may be: "Do you like this station?" and request an answer from the device. A data type indicates that the hot link is associated with sending or receiving data by using components within the device. For example, the data may be received using an infrared port on the device.

As will be appreciated by those of ordinary skill, in the art in view of the present disclosure, any message protocol used by the devices may be used to send and receive the hot link. For example, the short message service (SMS) protocol may be used. Generally, SMS is a protocol that allows short text and data messages to be sent and received over wireless networks. These SMS messages may be sent and received on a variety of cellular networks, including Global System for Mobile Communications (GSM) cellular networks. Generally, there are three types of SMS messages: GSM character set-encoded messages (effectively 7-bit encoded text), UCS2-encoded messages (Unicode encoded 16-bit text), and 8-bit binary-encoded messages. Typically, GSM-encoded messages and UCS2-encoded messages are textual and are displayed to the user by a messaging application as soon as they are received, whereas 8-bit binary-encoded messages are generally directed at providing device-specific information, such as device configuration messages. The Short Message Service (SMS) is the ability to send and receive text messages to and from mobile telephones. The text can comprise of words or numbers or an alphanumeric combination. A single short message can be up to 160 characters of text in length using default GSM alphabet coding, 140 characters when Cyrillic character set is used and 70 characters when UCS2 international character coding is used. Although SMS messages have a maximum length, the length of the ud element data field is not limited. The message may be split into pieces and then sent piece by piece. The device may then concatenate the pieces automatically.

SMS messages have a "User Data Header" which can contain additional information, such as source and destination port numbers (similar to TCP/IP), concatenation information that is used to support multi-part SMS messages, and the like. The User Data Header allows SMS messages to be customized.

Special characters or strings may be placed into an SMS messages to denote the message includes a hot link. For example, a message containing the string "!LI!" may indicate that the message contains a hot link and should be processed accordingly. Other information following the identifier "!LI!" may indicate the actions to perform. For example, "!RS**" may be used to indicate that the device should change a tuner to a radio station using the characters supplied in the wildcard pattern *. Similarly, "!TV" may indicate an action to tune a television to a certain station. "!CALL*-*-**" may indicate to call the corresponding telephone number. "!DOWNLOAD(LOCATION)" may be used to download a file from a specified location. For example, the location may be a web address or some other network address. As will be appreciated, the special characters are not displayed to the user.

The message may also contain information linking the actions with some user interface (physical or virtual) on the receiving device using link assign field 920. For example, "!LinkActionToCB" may instruct the receiving device to link the hot link to a command button.

Link action field 925 contains the instructions used to perform the action on the device. The instructions may be in any format that is understood by the receiving device. For example, the instructions may be device specific or a device independent set of instructions that are converted to the appropriate set of codes within the device to perform the actions.

Message field 930 stores a message provided to the user indicating the nature of the hot link. The message may be a text, sound, video, or a multimedia message. Message field 930 may also include a link to a location that includes the message. The link may be a pointer to a specific file, a link to a network address, and the like.

The specific message format may be many different types, and the example illustrated here is merely exemplary and not limiting.

Figure 10:
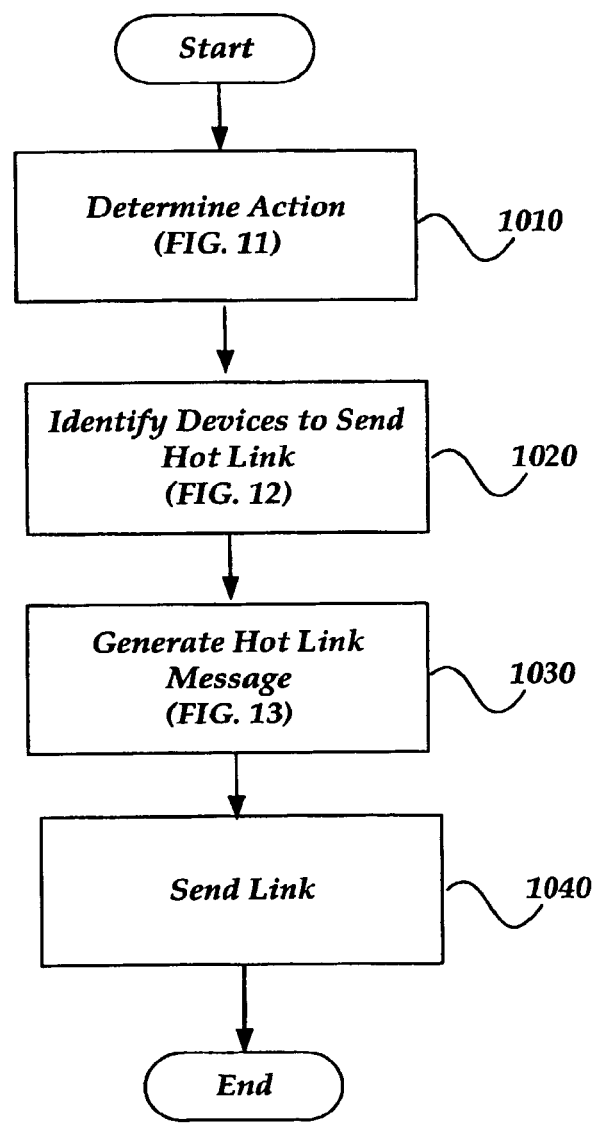
FIG. 10 illustrates a process for generating and sending a hot link to a device.

FIG. 10 illustrates a process for generating and sending a hot link to a device, according to one embodiment of the invention. After a start block, the logic advances to block 1010 where the hot link action is determined. The action can be performed by the device receiving the hot link either automatically or when a user interface is activated. For example, the action may be to tune a tuner within the device to a particular station, download a file, call a telephone number, fax a document, ask a question from other users, and the like. (See FIG. 11 and related discussion). Moving to block 1020, the devices to receive the hot link are identified. Briefly described, the devices are selected manually by the user, or automatically according to a set of preferences (See FIG. 12 and related discussion).

Transitioning to block 1030, the process generates the hot link message. Generally, the hot link message is prepared corresponding to the specifications of the devices receiving the hot link (See FIG. 13 and related discussion). Flowing to block 1040, the hot link message is sent to the identified devices. The hot link message is sent using the determined protocol and selected delivery method. The logical flow then returns to performing other actions.

Figure 11:
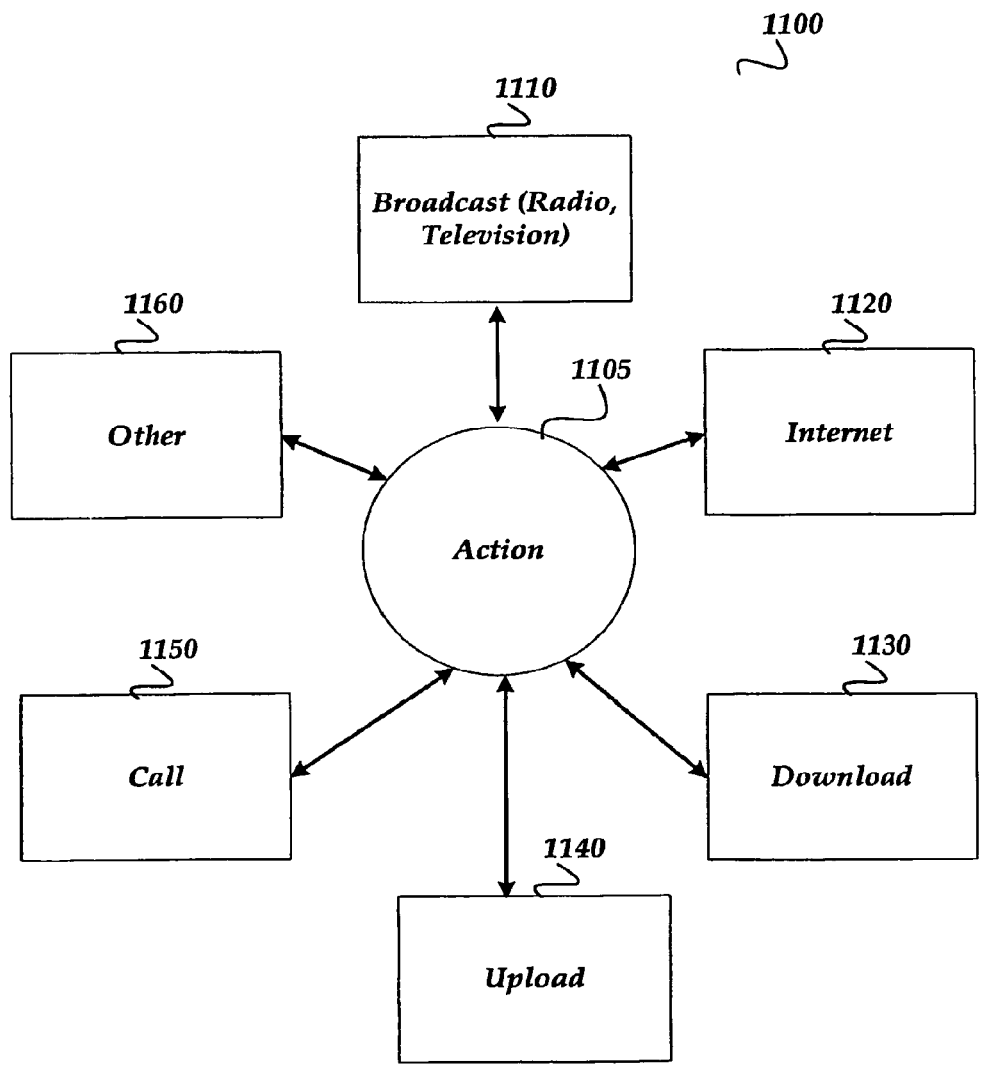
FIG. 11 illustrates a set of exemplary actions that may be included within a hot link.

FIG. 11 illustrates a set of exemplary actions that may be included within a hot link message, according to one embodiment of the invention. Action routine 1105 is associated with broadcast action 1110, Internet action 1120, download action 1130, upload action 1140, call action 1150, and other action 1160. The action to include within the hot link may be provided in many different ways. For example, the action may be automatically identified based on the current use of the device generating the hot link, or manually selected by the user (See FIG. 7 and related discussion). For example, suppose the user desires to send a hot link to a device instructing it to tune to a station playing a particular song when the user interface is activated. The mobile device may determine the identifying information relating to the song as it is playing on the device.

Broadcast action 1110 may be any action relating to a broadcast. The broadcast may be a television broadcast, a radio broadcast, or some other broadcast. The broadcast action indicates to action routine 1105 the broadcast location corresponding to the desired broadcast. For example, the call letters of the broadcast may be used to identify the broadcast location. The user may also manually identify the broadcast action. For example, the user may enter a text description of the broadcast. The input may include the call letters, the name of the show, and the like. Internet action 1140 is an action related to the Internet. For example, the Internet action may access a particular site on the Internet. Download action 1130 and upload action 1140 instruct the device to download or upload data from/to a particular location. The data may be on a network or the data may be on another device and beamed to the receiving device, or a cable connection may be used to couple the devices to transfer the data. Call action 1150 is an action instructing the device to call a particular number. The call may be a voice or data call. Other action 1160 instructs the device to perform some other action.

Figure 12:
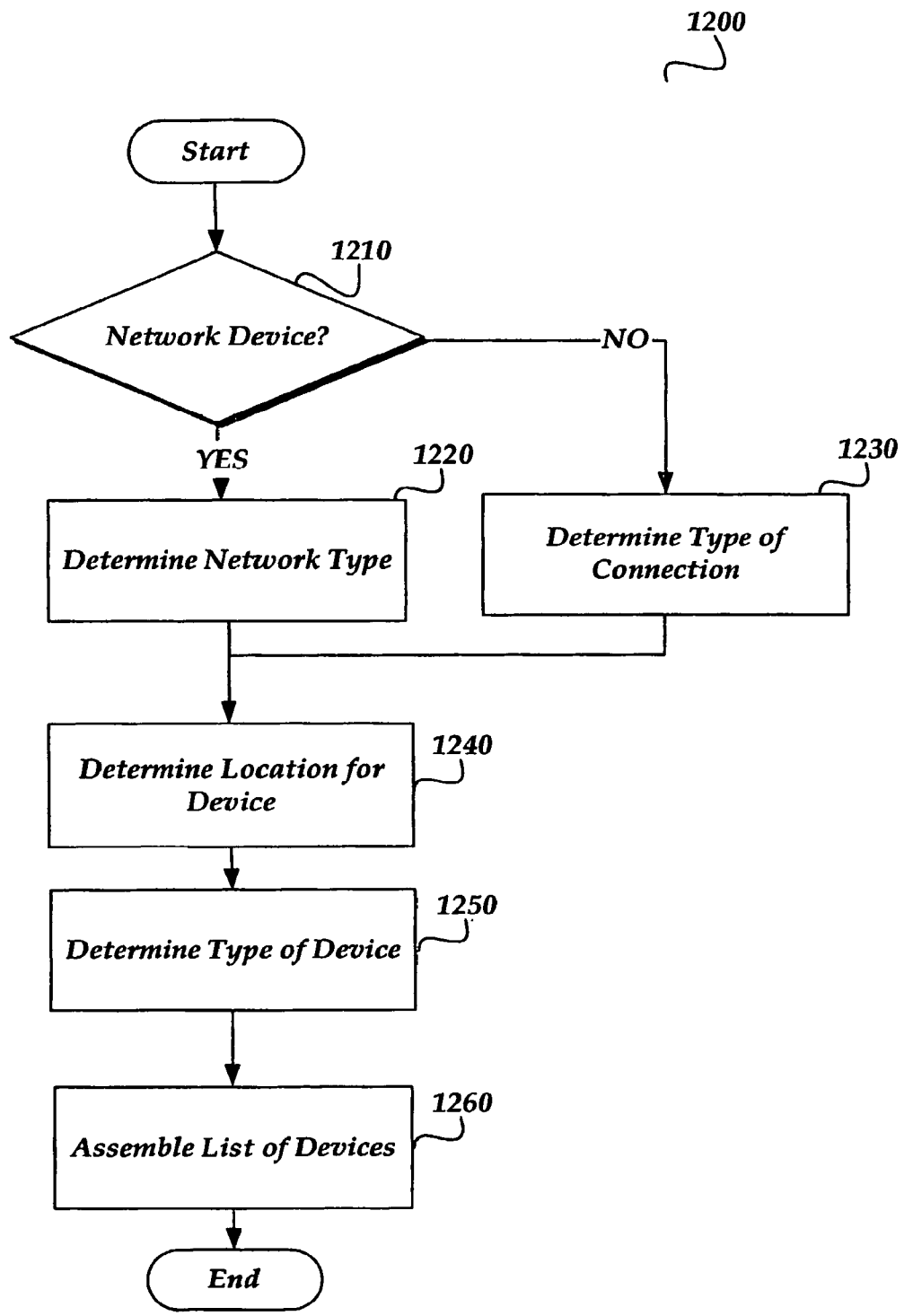
FIG. 12 illustrates a process for identifying devices to send the hot link message.

FIG. 12 illustrates a process for identifying devices to send the hot link message, according to one embodiment of the invention. After a start block, the process moves to decision block 1210 that determines whether the receiving device is a network device. When the device is a network device the process moves to block 1220, where the logic determines the network type. For example, is the network a wireless network or a wired network. The network type is used to determine the protocol and message format used to send the hot link message to the device. When the device is not a network device, the process moves to block 1230 that determines the type of connection used between the device sending the hot link message and the device receiving the hot link message. The connection may be a wireless connection or a wired connection. For example, an infrared port may be used to communicate with another device wirelessly, or an RS-232, USB, FIREWIRE, or some other physical cable connection may be used to connect the devices physically. Transitioning to block 1240, a location for the device is determined. The location may be a network address, a telephone number, a frequency, or some other information uniquely identifying the location of the device receiving the hot link message. Moving to block 1250, the type of device is determined. The type of device relates to information that is used to create a set of instructions relating to the action that are generated for the device. For example, the device may be a certain brand of cell phone, PDA, personal computer, and the like. A default device may also be used if the device type may not be determined. For example, the default device type may only support a subset of the instructions for the device but are selected to work across a number of supported devices. At block 1260, the device is added to a list of devices to which the hot link message is to be sent. The list contains the information used to create the hot link message. The list may contain as few as one device. The process then ends.

Figure 13:
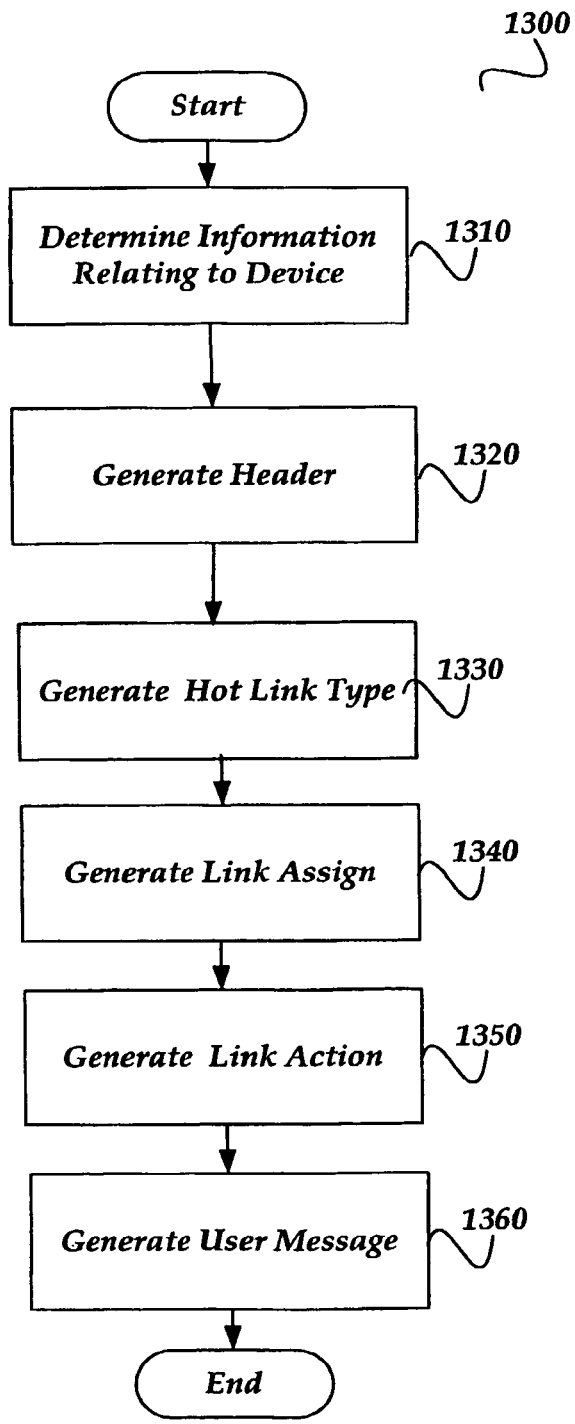
FIG. 13 illustrates a process for generating a hot link message for a device, in accordance with aspects of the invention.

FIG. 13 illustrates a process for generating a hot link message for a device, according to one embodiment of the invention. After a start block, the process moves to block 1310 at which point the process determines information relating to the device for which to prepare the message. The device information may be obtained from the list of devices assembled according to the process described in FIG. 12. The information is used to prepare the message according to the specifications of the receiving devices. For example, the instructions to tune a personal computer to a particular broadcast may be different than to tune a mobile device to the same broadcast. Flowing to block 1320, the header of the hot link message is generated. The header contains the address information for the receiving device. For example, the address may be an IP address associated with the receiving device. Moving to block 1330, the hot link type is added to the message. For example, a hot link type could be a hypertext type, a telephone number type, a broadcast type (e.g. radio or television station call letters), a user's name type, a display type, a download type, an upload type, and the like. If special characters or strings are used to indicate the type, then those characters are generated and inserted into the message. As discussed above, the hot link message may contain many different fields. A special character or string can be used to denote the presence of a hot link within a message. For example, the string "!LI!" could be placed in the message to indicate that a hot link is present. Numerical designators may be used as to indicate the type of link. For example, adding the number "1" to the string could indicate that a hypertext link is present in the hot link message. The number "2" could represent the presence of a radio station frequency, the number "3" could represent the presence of radio station call letters, and the number "4" could represent the presence of television station call letters. Thus, the presence of a hypertext link in a message would be disclosed by string "!LI!1", a link to radio station by frequency would be string "!LI!2", a link to a radio station by call letters would be "!LT!3", and a link to a television by call letters would be "!LT!4." Many other identifying methods may be used to identify the hot link within the message.

At block 1340, the process generates the link assign information. The link assign information assigns the hot link to a user interface on the receiving device. The information may indicate a particular key on the receiving device, such as a command button, or may be automatically assigned to another user interface based on a user's preference or other factors. In one embodiment, a user can predetermine a button on a key pad to be used as a user interface. For example, the user may have a preference that sets the "#" button on their device as the user interface. Transitioning to block 1350, the instructions to perform the action are generated and included within the message. The generated link action instructs the device receiving the link to perform a set of actions to perform the various action associated with the hot link. Moving to block 1360, a user message may be generated that is presented to the user, either visual or auditory, to inform the user of the receiving device that the hot link has been received. The process then returns to performing other actions.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A mobile device method, comprising:
   determining an action to be performed by a mobile device upon activation of a user interface element of the mobile device, the user interface element being on the mobile device prior to generation of hot links associated with the user interface element;
   generating a hot link to perform the action;
   generating a message containing the hot link and assignment information assigning the hot link to the user interface element of the mobile device; and
   sending the message to the mobile device.

2. The method of claim 1, wherein the method further comprises:
   determining a connection type for sending the message to the mobile device; and
   determining a location of the mobile device.

3. The method of claim 2, wherein said generating of the message further comprises including the location of the mobile device in the message.

4. The method of claim 2, wherein said generating of the message comprises formatting in accordance with a protocol corresponding to the connection type for sending the message to the mobile device.

5. The method of claim 1, wherein the action includes at least a selected one of a broadcast action, an Internet action, a download action, an upload action, and a call action.

6. The method of claim 1, wherein said generating of a hot link to perform the action comprises generating instructions that direct the recipient mobile device to tune to a broadcast.

7. The method of claim 1, wherein said generating of a hot link to perform the action comprises generating instructions to access an Internet site.

8. The method of claim 1, wherein said generating of a hot link to perform the action comprises generating instructions that direct the recipient mobile device to call a number.

9. The method of claim 1, wherein said generating of a hot link to perform the action comprises generating instructions that direct the recipient mobile device to download data.

10. The method of claim 1, wherein said generating of a hot link to perform the action comprises generating instructions that direct the recipient mobile device to upload data.

11. The method of claim 1, wherein the mobile device is a member of a PAL LIST of a user of another mobile device.

12. In a mobile device, a method of operation comprising:
    receiving a message comprising a hot link and assignment information assigning the hot link to a user interface element of the mobile device that was on the mobile device prior to generation of the assignment information, the hot link comprising instructions to perform an action;
    extracting the hot link and the assignment information;
    assigning the hot link to the user interface element in accordance with the extracted assignment information;
    executing the hot link to perform the action, responsive to a selection of the assigned user interface element.

13. The method of claim 12, wherein the action includes at least a selected one of a broadcast action, an Internet action, a download action, an upload action, and a call action.

14. An apparatus comprising:
    a computing processor to execute instructions; and
    a non-transitory computer storage medium coupled to the processor, and having stored therein instructions that, when executed by the processor, enable the apparatus to:
        determine a first action to be performed by a mobile device upon activation of a user interface element of the mobile device, the user interface element being on the mobile device prior to generation of hot links associated with the user interface element;
        generate a first hot link to perform the first action;
        generate a first message containing the first hot link, and first assignment information assigning the first hot link to the user interface element of the mobile device; and
        send the first message to the mobile device.

15. The apparatus of claim 14, wherein said generating of the first message comprises formatting the message for a protocol in view of a connection type to be used to send the message to the mobile device.

16. The apparatus of claim 15, wherein the protocol is short message service.

17. The apparatus of claim 14, wherein the user interface element includes at least one of a keypad, a hot key, a soft key, a touchpad, a wheel, a slide button, a push button, a pointing device, a virtual button, icon, a symbol, a graphic and an element of a graphical user interface.

18. The apparatus of claim 14, wherein said generating of the first hot link comprises generating instructions directing the mobile device to tune to a broadcast.

19. The apparatus of claim 14, wherein said generating of the first hot link comprises generating instructions directing the mobile device to access an Internet site.

20. The apparatus of claim 14, wherein said generating of the first hot link comprises generating instructions directing the mobile device to call a number.

* * * * *